United States Patent [19]

Jackson et al.

[11] 4,079,509
[45] Mar. 21, 1978

[54] METHOD OF MANUFACTURING SEMI-CONDUCTOR DEVICES

[75] Inventors: Sydney Jackson, Hayfield; Alan Arthur Shepherd, Bramhall, both of England

[73] Assignee: Ferranti Limited, Hollinwood, England

[21] Appl. No.: 586,855

[22] Filed: Jun. 16, 1975

Related U.S. Application Data

[62] Division of Ser. No. 327,638, Jan. 29, 1973, Pat. No. 3,931,922.

[51] Int. Cl.² .............................................. B01J 17/00
[52] U.S. Cl. .................................... 29/589; 29/569 R; 29/740; 29/759; 228/180 A
[58] Field of Search ...................... 29/576 S, 588, 589, 29/203 P, 203 J, 626; 228/180

[56] References Cited

U.S. PATENT DOCUMENTS

3,517,438  6/1970  Johnson .............................. 29/576 S

*Primary Examiner*—W. Tupman
*Attorney, Agent, or Firm*—Cameron, Kerkam, Sutton, Stowell & Stowell

[57] ABSTRACT

Semiconductor devices are mounted on corresponding lead frames by being inserted into apertures of a masking member in a desired registration with the lead frame strip.

28 Claims, 9 Drawing Figures

METHOD OF MANUFACTURING SEMI-CONDUCTOR DEVICES

This is a Division, of application Ser. No. 327,638, filed Jan. 29, 1973, now U.S. Pat. No. 3,931,922.

This invention relates to the mounting of semiconductor devices on supports, each support including a matrix of conductors initially in the form of a lead frame, the lead frame being part of a lead frame strip, a plurality of identical lead frames being uniformly distributed along, and being uniformly orientated with respect to, the longitudinal axis or the strip. The lead frames may be formed in a metal layer of a composite body comprising the metal layer on a major face of an insulating substrate.

Each lead frame of the strip may comprise the support for a semiconductor device; or may comprise a carrier lead frame which is bonded, for example, to a larger, main lead frame, or to a conventional header arrangement, to complete the support for the semiconductor device. The semiconductor device on its support is then encapsulated by being moulded within a plastics material or by being enclosed in a hermetically-sealed, evacuated enclosure. At least a part of the conductor matrix of the lead frame is encapsulated with the semiconductor device, the conductor matrix being wholly encapsulated if it initially comprised part of merely a carrier lead frame of the support for the semiconductor device.

The conductor end portions of the conductors of each lead frame of such a strip is arranged to be such that a corresponding semiconductor device, when correctly orientated, is capable of being mounted satisfactorily on the lead frame by each device contact being connected exclusively to a co-operating conductor end portion.

Previously it has been known to use precision optical aligning means to ensure that the corresponding semiconductor devices are sufficiently accurately located on the end portions of the conductors of the lead frames of such a strip, in order to arrange that each device contact may be connected exclusively to a co-operating conductor end portion.

It is an object of the present invention to provide novel apparatus for mounting corresponding semiconductor devices onto such a lead frame strip, which apparatus ensures that, without employing precision optical aligning means, the devices are sufficiently accurately located on the co-operating end portions of the conductors of the lead frames for the subsequent satisfactory mounting of the devices.

According to the present invention apparatus for mounting semiconductor devices each rectangular-shaped in plan on a strip of corresponding lead frames, the lead frames being uniformly spaced along the longitudinal axis of the strip, each lead frame having a matrix of conductors, comprises a masking member defining at least one rectangular-shaped aperture, means for feeding the lead frame strip longitudinally through part of the apparatus with the aperture defined in the masking member being in a desired registration on a lead frame of the lead frame strip, conductor end portions for connection to contacts of a corresponding semiconductor device being exposed through the aperture, the arrangement of the lead frame and the aperture being such that when a corresponding semiconductor device is inserted in the required orientation into the aperture each device contact is exclusively opposite to a co-operating conductor end portion, and in said part of the apparatus there is included means to bond the device contacts to the co-operating conductor end portions.

In one form of the appartus the aperture defined in the masking member may have dimensions to allow a corresponding semiconductor device to be a sufficiently close fit within the aperture, to ensure that each device contact exclusively is opposite to the conductor end portion to which the contact is to be connected, when the masking member is in the required registration with the lead frame.

In another form of the apparatus the arrangement of the lead frame strip and the aperture defined in the masking member may be such that the following walls of the aperture as the masking member is fed through the apparatus are inclined in relation to the longitudinal axis of the lead frame strip, and each device contact exclusively is opposite to the conductor end portion to which the contact is to be connected when the masking member is in the required registration with the lead frame and the device is contiguous with the following walls of the aperture. Means may be provided to ensure that the corresponding semiconductor device is contiguous with the following walls of the aperture when the masking member is in the desired registration with the lead frame.

The aperture defined in the masking member may be square-shaped in plan, being arranged to receive a corresponding semiconductor device which is also square-shaped in plan.

The masking member may define a plurality of apertures, the arrangement being such that consecutive apertures expose conductor end portions of consecutive lead frames of the lead frame strip.

Automatic means for inserting corresponding semiconductor devices in each aperture defined in the masking member when the masking member is in the desired registration with the lead frame strip may be provided; or the devices may be inserted manually.

According to another aspect of the present invention a method of mounting semiconductor devices each rectangular-shaped in plan on a strip of corresponding lead frames, the lead frames being uniformly spaced along the longitudinal axis of the strip, each lead frame having a matrix of conductors, comprises placing in the desired registration on a lead frame of the lead frame strip a masking member defining at least one rectangular-shaped aperture, conductor end portions for connection to contacts of a corresponding semiconductor device being exposed through the aperture, inserting a corresponding semiconductor device in the required orientation into the aperture so that each device contact is exclusively opposite to a co-operating conductor end portion, and bonding the device contacts to the co-operating conductor end portions.

The present invention will now be described by way of example with reference to the accompanying drawings, in which.

Figure 1:
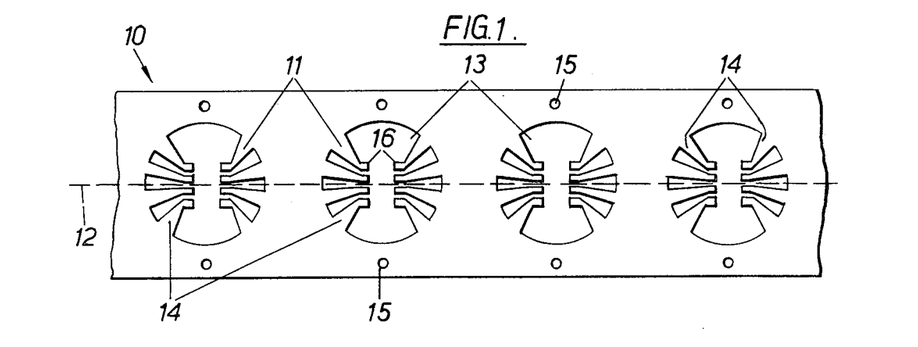
FIG. 1 is a plan view of part of a carrier lead frame strip.

FIG. 1 shows part of a strip 10 comprising a plurality of identical carrier lead frames 11. The carrier lead frames 11 are for use in supports for corresponding semiconductor devices, and are uniformly distributed along, and are uniformly orientated with respect to, the longitudinal axis of the strip 10, the longitudinal axis being indicated by the broken line 12. The carrier lead frames 11 are supported on a flat, elongated, insulating substrate 13 of uniform width, and are shown between the constituent conductors 14 of the carrier lead frames 11. The insulating substrate 13 is of a polyimide and is sufficiently thick to provide the requisite support for the carrier lead frames 11.

Initially sprocket holes 15 are precisely punched adjacent to the longitudinal edges of the substrate 13, to ensure that the substrate is accurately positioned both in apparatus for forming the carrier lead frames 11, and in apparatus for mounting corresponding semiconductor devices on the carrier lead frames 11.

The carrier lead frames 11 are formed in a layer of silver evaporatively deposited on the substrate 13, the thickness of the silver layer having the desired thickness for the carrier lead frames. The carrier lead frames 11 are then formed from the silver layer in a precise manner, by a known method employing photolithographic etching techniques. Thus, the carrier lead frames 11 are precisely located on the substrate 13 and, in particular, inner end portions 16 of the conductors 14 of the carrier lead frames are precisely located in relation to the sprocket holes 15.

The parts of the silver layer extending between the carrier lead frames 11 are not removed and hence, each carrier lead frame is part of an integral structure formed within the silver layer. The carrier lead frames are completed by electrolytically depositing on their exposed surfaces a layer of tin 17, shown in FIG. 4.

Each semiconductor device when satisfactorily mounted on a lead frame of the strip 10 has a contact connected to a conductor 14 of the lead frame. Thus, the pattern of the inner conductor end portions 16 of each carrier lead frame 11 corresponds to the pattern of contacts on each device.

Figure 2:
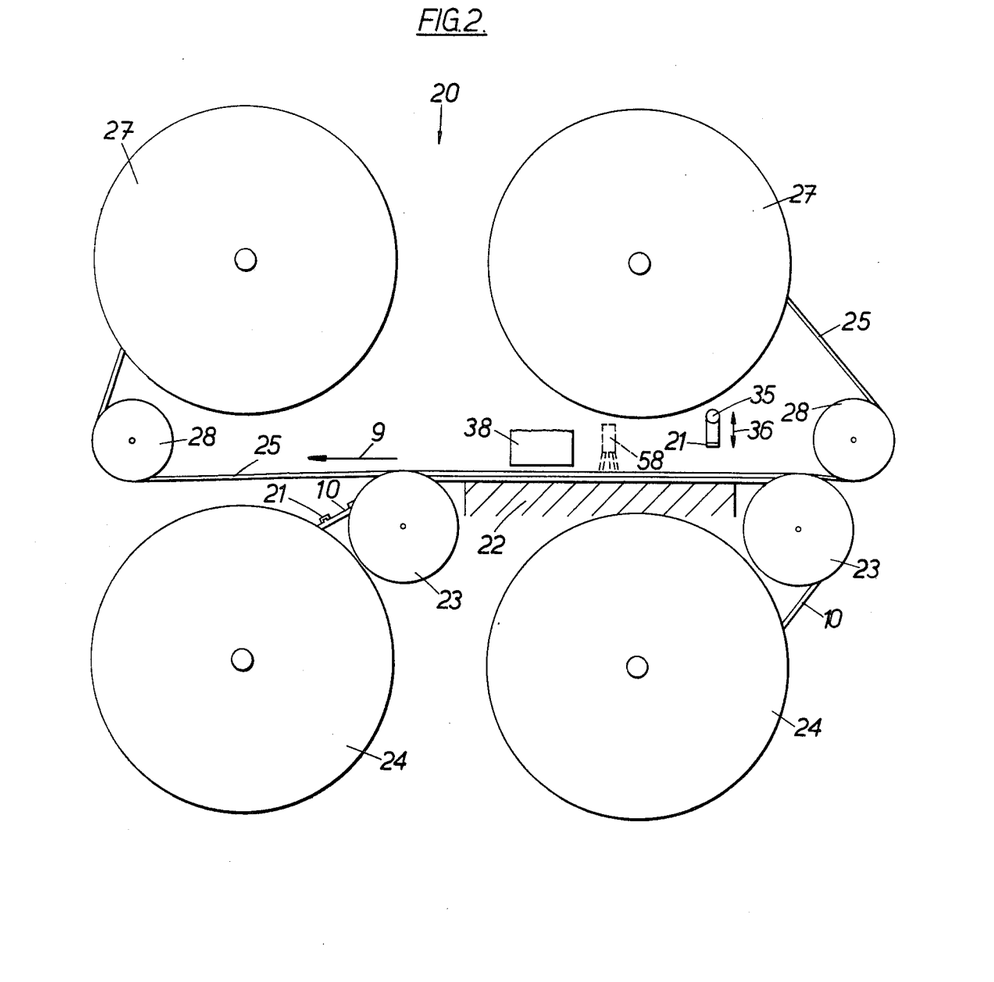
FIG. 2 is an elevation of one embodiment of apparatus according to the present invention for mounting semiconductor devices on the carrier lead frames of the strip of FIG. 1, the apparatus employing a masking member through apertures defined in which, whilst the mounting operation is being performed, the co-operating end portions of the conductors of the carrier lead frames to be connected to the corresponding semiconductor devices are exposed.

The apparatus 20 by which the semiconductor devices 21 are mounted on the lead frames is shown partially, and in diagrammatic form, in FIG. 2. The strip 10 of carrier lead frames is fed in a controlled manner over a worktable 22 by engagement of the sprocket holes 15 with two sprocket wheels 23, a wheel 23 being at either end of the worktable 22 which may be designated as first and second stations, the wheels 23 being rotated by control means (not shown). The strip 10 is fed between reels 24, the reels being changed when the strip 10 has passed over the worktable 22. An elongated masking member 25 of the polyimide is passed over the lead frame strip 10 whilst it is on the worktable 22. Movement of the strip 10 and member 25 is from right to left as viewed in the drawing and is represented by arrow 9. The masking member 25 is of the same width as the lead frame strip 10 and is provided with sprocket holes 26 (not shown in FIG. 3), accurately punched along its longitudinal edges in the same manner as the sprocket holes 15 of the lead frame strip 10. The sprocket holes 26 in the masking member 25 are such that the masking member may be passed over the worktable 22 on the lead frame strip 10 with the sprocket holes 26 being engaged by the sprocket wheels 23. Hence, the sprocket holes 26 of the masking member are required to be slightly different size, and to be spaced apart by a slightly different amount, than the sprocket holes 15 of the strip 10, in order to take into account the curvature of the sprocket wheels 23.

Thus, the masking member 25 is precisely located on the lead frame strip 10 and is fed in the same controlled way as the lead frame strip over the worktable 22, between reels 27, via idlers 28, and via the sprocket wheels 23. The reels 27 are changed over when the masking member 25 has passed over the worktable 22.

Figure 3:
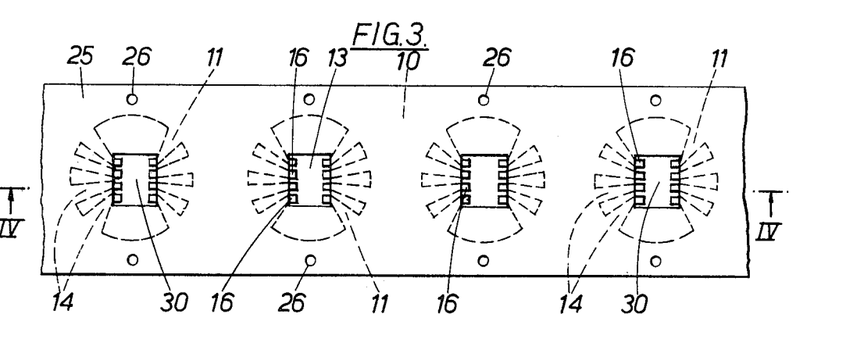
FIG. 3 is a plan view of the masking member when on the carrier lead frame strip.

The masking member 25 is pre-formed by precisely punching identical square-shaped apertures 30 uniformly distributed along the longitudinal axis of the member 25, as shown in FIG. 3, and simultaneously with the punching of the sprocket holes 26. The apertures 30 are arranged to be in such a relationship to the sprocket holes 26 that, with the masking member 25 in the desired registration with the carrier lead frame strip 10 on the worktable 22, the inner end portion 16 of each conductor 14 of the strip 10 is exposed. FIG. 3 is a plan view of the masking member 25 whilst on the worktable 22 of the apparatus 20, and the carrier lead frames 11 beneath the masking member 25 are indicated in broken line form, except for the conductor end portions 16 exposed through the apertures 30.

Figure 4:
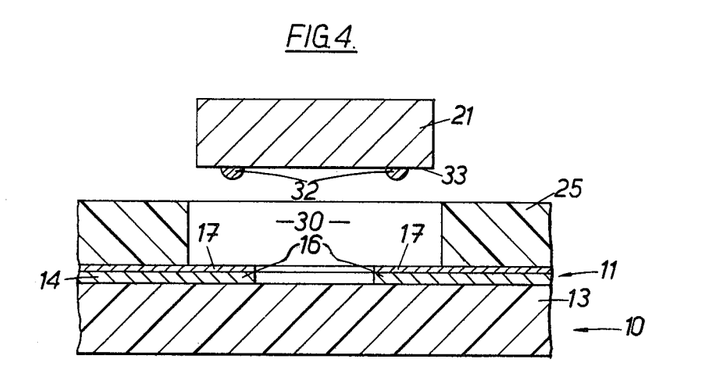
FIG. 4 is a section through part of a carrier lead frame of the strip, and also shows a corresponding semiconductor device ready to be mounted on the carrier lead frame.

As shown in FIG. 4, the length of each side of each square-shaped aperture 30 in the masking member 25 is such that the square-shaped semiconductor devices 21 to be mounted on the carrier lead frames 11 are a close fit within the aperture 30. This figure comprises a section of the masking member 25 on the carrier lead frame strip 10, and shows a corresponding semiconductor device ready to be mounted on a carrier lead frame. Sufficiently accurate registration between the contacts on the devices 21 and the co-operating conductor end portions is ensured by arranging that the devices are a close fit within the apertures 30.

Each semiconductor device 21 is formed in a known manner, and has contacts 32 comprising hemispherical solder protrusions on a passivated surface 33 of the device. The protrusions are formed on selected parts of aluminium conductors on the passivated surface 33, the selected aluminium parts being rendered solderable by depositing chemically a first, temporary, layer of zinc from a solution of zinc oxide and caustic soda, removing the first zinc layer with nitric acid solution, and depositing a second, permanent zinc layer on the now clean surface of the aluminium. The second zinc layer has an activated surface and a nickel layer is formed on this surface by the action of a reducing agent on an acid solution of nickel chloride with sodium hypophosphite or sodium borohydride. The surface 33 of the passivating layer on the semiconductor device surrounding the solder protrusions 32 is rendered nonwettable by molten solder, so that molten solder does not spread over this surface. The solder protrusions 32 are formed in a precise manner and are accurately located on the surface 33.

The difference between the length of each side of each square-shaped aperture 30 in the masking member 25 and the length of each side of each square-shaped device 21 is arranged to be at most equal to the radius of the hemispherical solder protrusions 32 on the device. Further, the arrangement is such that, when the semiconductor device 21 is inserted into the aperture 30, and is correctly orientated in relation to the longitudinal axis of the lead frame strip 10, each solder protrusion contact 32, inevitably, is exclusively opposite to the conductor end portion 16 with which it is required to be connected. This latter criterion is ensured by the accuracy of the size of the aperture 30 of the masking member 25 and by the closeness of the fit of the device within the aperture 30; by the accuracy with which the conductor end portions 16 and the device contacts are formed, respectively, on the insulating substrate 12 and the device 21; and by the accuracy of the location of the aperture 30 of the masking member 25 in relation to the conductor end portions 16, when the lead frame strip 10 and the masking member 25 are in the desired registration with each other.

Thus, it is only necessary to ensure that the corresponding semiconductor devices 21 are correctly orientated in relation to the longitudinal axis of the lead frame strip when inserted in the aperture 30 of the masking member 25. The devices 21 may be inserted manually in the apertures 30 or, as shown in FIG. 2, the apparatus 20 may include automatic means 35 for inserting the devices. The automatic means 35 includes a suction head for holding the devices, and indexing mechanism for raising and lowering the head, in the direction of the arrow 36, to deposit the devices in the aperture 30, and for moving the head between a position over an aperture 30 and a position where it is capable of picking up a device. In any event, the devices 21 may be placed in the apertures 30 without employing precision optical aligning means, and at a faster rate than the locating of a semiconductor device over end conductor portions of a lead frame to a sufficient degree of accuracy by precision optical aligning means.

The carrier lead frame strip 10, whilst on the worktable 22, and after the semiconductor devices 21 have been inserted in the apertures 30 in the masking member 25, is heated by means 38 to cause the solder protrusions 32 on the devices 21 to melt. When resolidified, and the devices 21 are bonded to the carrier lead frames, the solder forms the desired electrical interconnections between the semiconductor devices 21 and the conductors 14 of the carrier lead frames 11. Whilst molten, surface tension forces cause the solder to have the least possible surface area and, thus, each semiconductor device is pulled in the plane of the semiconductor device into exact registration with the conductor end portions 16 of the carrier lead frame 11, if the initial placing of the semiconductor device 21 in the aperture 30 had not achieved this. The solder protrusions 32 melt at the temperature of 183° C, and the performances of silicon semiconductor devices are not adversely affected by subjecting the semiconductor devices to this temperature.

The semiconductor devices 21 are mounted on the carrier lead frames 11 to provide so-called flip-chip structures.

Thus, the devices 21 are mounted on the strip 10, and are removed from the apertures 30 in the masking member 25 when the masking member 25 is separated from the strip 10 at the second sprocket wheel 23. The strip 10, with the semiconductor devices mounted thereon, is wound up on the reel 24. In one particular embodiment according to the present invention the accuracy of the size and the location of the sprocket holes 15 in the carrier lead frame strip 10, the sprocket holes 26 in the masking member 25, and the apertures 30 in the masking member 25, is $\pm 15 \times 10^{-4}$ inch.

Figure 5:
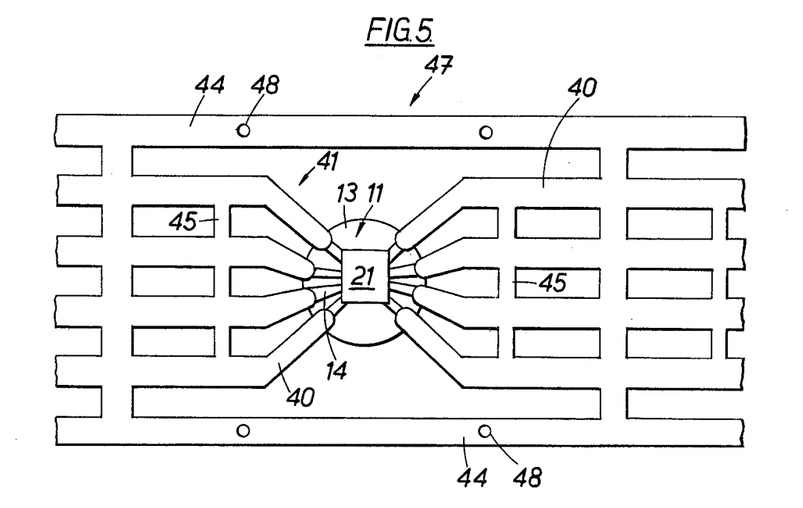
FIG. 5 is a plan view of a carrier lead frame, carrying a semiconductor device, and secured to a larger main lead frame to complete the support for the semiconductor device.

Subsequently, each carrier lead frame 11, with the associated semiconductor devices 21, is severed from the strip 10. The part of the polyimide substrate 13 beneath the carrier lead frame is removed with the carrier lead frame. The exposed surfaces of the remaining outer portions of each conductor 14 are then soldered to co-operating conductors 40 of a larger, main lead frame 41, as shown in FIG. 5, to complete the support for the device 21. The main lead frame 41 is made of nickel plated with silver, and is stamped from a composite sheet in a multi-stage process. Each carrier lead frame 11 is secured to the co-operating main lead frame 41 by employing a conventional reflow soldering process. The soldering action occurs at regions of the lead frames 11 and 41 remote from the semiconductor device and, thus, these regions of the lead frames may be subjected to the solder melting temperature without adversely affecting the performance of the semiconductor device.

Figure 6:
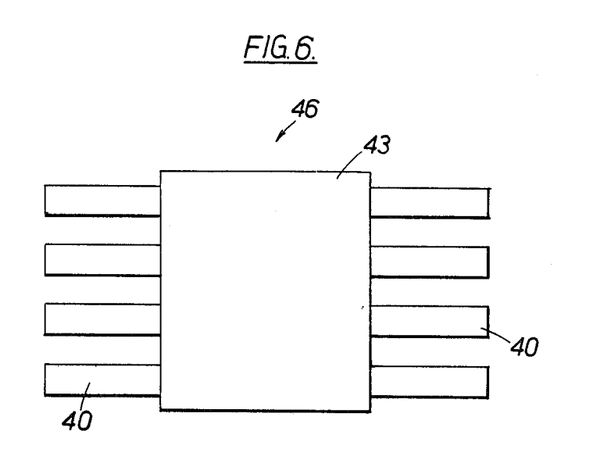
FIG. 6 shows a completed package for the semiconductor device, the package being in the form of a so-called "flat-pack," in which package the device and the carrier lead frame of FIG. 5 are encapsulated in an epoxy resin.

The package for the semiconductor device 21 is completed by encapsulating the semiconductor device and the carrier lead frame in an epoxy resin 43 moulded in situ around the combination, as shown in FIG. 6. The conductors 40 of the main lead frame 41 are then rendered electrically discrete by removing the boundary part 44 of the main lead frame 41 by breaking tie-bars 45 extending between the conductors 40 of the main lead frame. The completed package 46 has the so-called "flat-pack" construction.

A plurality of main frames 41 also are initially in the form of a strip 47 and a plurality of semiconductor device-carrier lead frame combinations may be mounted simultaneously on the strip 47, and may be encapuslated in the epoxy resin 43, in a batch process. Suction means for positioning the combinations on the main lead frames 41, moulding apparatus for the epoxy resin 43 and severing means to render the conductors 40 of the main lead frames electrically discrete, all may be embodied in apparatus to enable these process steps to be completed automatically. The boundary part 44 of each main lead frame 41 of the strip 47 is provided with sprocket holes 48 to ensure that the strip 47 is correctly positioned at different stages in the automatic apparatus employed in performing each of these steps.

Figure 7:
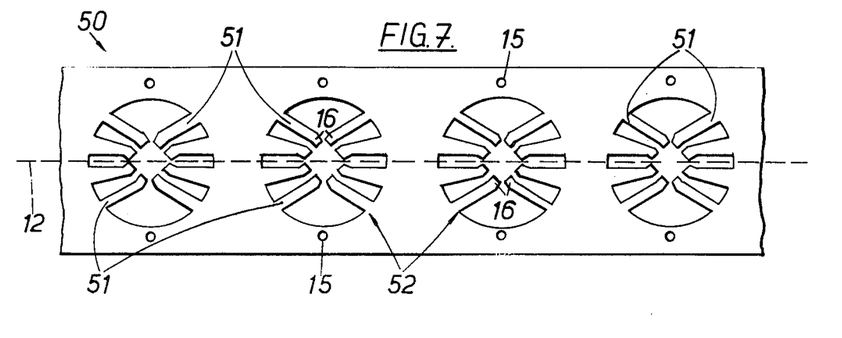
FIG. 7 is a plan view of another embodiment of a lead frame strip.
Figure 8:
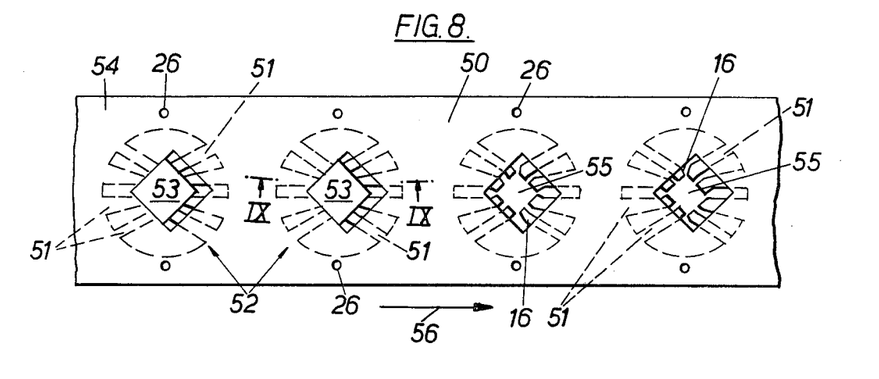
FIG. 8 is a plan view of the masking strip when on the lead frame strip of FIG. 7.
Figure 9:
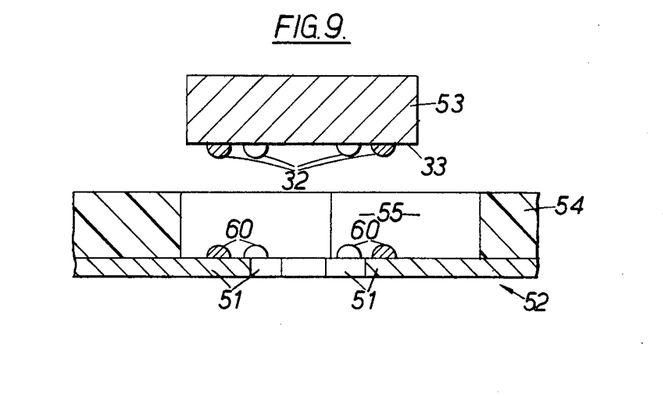
FIG. 9 is a section on the line IX — IX of FIG. 8, and also shows a corresponding semiconductor device ready to be mounted on the lead frame strip.

Another embodiment of a lead frame strip 50 is shown in FIGS. 7 to 9, and parts of this lead frame strip identical with or closely resembling parts of the carrier lead frame strip 10 of FIGS. 1 to 6 are given the same reference numbers as the parts of FIGS. 1 to 6 the direction of movement of the carrier lead frame strip of FIGS. 7 to 9 through the apparatus is from left to right as viewed in the drawing and as represented by the arrow 56 shown in FIG. 8.

The conductors 51 of the lead frames 52 of the lead frame strip 50 are arranged to co-operate with contacts 32 on four sides of a semiconductor device 53.

In FIG. 8, which corresponds to FIG. 3, and is a plan view of the masking member 54 whilst in the desired registration on the lead frame strip 50, the lead frames 52 beneath the masking member 54 are indicated in broken line form, excpet for the conductor end portions 16 exposed through the apertures 55 in the masking member 54. The right-hand side of this Figure shows the arrangement of the apertures 55 and the lead frames 52. The left-hand side of the Figure shows semiconductor devices within the apertures 55.

Each square-shaped aperture 55 in the masking member 54 has walls which are inclined at 45° to the longitudinal axis 12 of the lead frame strip. When a semiconductor device 53 is inserted in an aperture 55, and is fed through the apparatus on the lead frame strip 50, inevitably it becomes contiguous with the following walls of the aperture so that its position within the aperture 55 is known precisely. Means, such as a brush with glass fibre bristles, and shown in broken line form at 58 in FIG. 2, is employed to ensure that each semiconductor device 53 is swept to be contiguous with the following walls of the aperture 55.

FIG. 9 corresponds to FIG. 4, comprising a section of the masking member 54 on the lead frame strip 50, and shows a semiconductor device 53 ready to be mounted on a lead frame 52.

Instead of the whole of the lead frames being tinned, solder protrusions 60, of the same size as the solder protrusions 32 on the semiconductor devices 53, are formed on the end portions 16 of the lead frame conductors 51. The arrangement of the masking member 54 when in the desired registration with the lead frame strip 50 is such that, with a corresponding semiconductor device 53 inserted into an aperture 55, and correctly orientated in relation to the longitudinal axis 12 of the lead frame strip 50, each solder protrusion device contact 32 inevitably is exclusively opposite to the protrusion 60 on the conductor with which it is required to be connected. This criterion is ensured by the accuracy with which the conductor end portions, the protrusions 60 and the device contact protrusions 32 are formed; and by the accuracy of the location of the aperture 55 of the masking member 54 in relation to the conductor end portions 16.

Thus, when the solder is melted, to form the desired electrical interconnections between the device contacts and the conductors, the co-operating pairs of protrusions coalesce with each other, and surface tension forces ensure that the device contacts are in exact registration with the end portions 16 of the conductors 51.

The lead frame strip 50 is not provided on an insulating substrate, but is stamped from a metal sheet in a precision way in a multi-stage stamping process. Thus, the lead frame strip 50 closely resembles the main lead frame strip 47 of FIG. 5. Further, each lead frame 52 comprises the sole support for the semiconductor device 53.

For convenience a device 53 with only eight contacts 32 is illustrated, but it will be appreciated that the device may have many more contacts along its periphery.

The lead frame strips 50 is wound around a reel after the semiconductor devices 53 have been mounted on the strip, and because the lead frame strip is not on an insulating substrate a separate insulating sheet is provided between the turns of the lead frame strip when wound upon the reel.

Although each semiconductor device 53 is mounted only on a single lead frame 52, the extension of the outer portions of the conductors 14 of a carrier lead frame 11 beyond the periphery of the semiconductor device 21 ensures that it is easier to mount such a combination on a main lead frame 41 of FIG. 5, than to mount the semiconductor device on the single lead frame 52 of FIGS. 7 to 9 having dimensions corresponding to those of the main lead frame 41. This is because the inner end portions of the conductors 40 of the main lead frame 41 are spaced further apart than for a single lead frame 52. Thus, the locating of the carrier lead frame-semiconductor device combination over these inner end portions of the conductors 40 of the main lead frame 41 is easier than for the semiconductor device 53 alone over the inner end portions of the conductors of the single lead frame 52.

The contacts on the semiconductor devices may be of any suitable form, and need not necessarily comprise protrusions of solder.

The apparatus 20, described above with reference to FIG. 2, may take many different forms. In particular, the means for feeding the lead frame strip and the masking member in the desired registration with each other through the apparatus may take any convenient form. Thus, it may not include sprocket wheels, or it may include only one sprocket wheel, or it may have a different sprocket wheel or wheels to feed the carrier lead frame strip and the masking strip.

The masking member instead of having a plurality of apertures, may have only one aperture. Thus, the masking member may be placed repetitively in the desired registration on the lead frames on the worktable. Hence, after a semiconductor device has been inserted into the aperture and has been bonded to a lead frame, the masking member is removed, the lead frame strip is displaced to bring a different lead frame onto the worktable, and the masking member is replaced in the desired registration with the new frame on the worktable. Such a reciprocating action may also be employed with a masking member having a plurality of apertures, in each location of the masking member on the lead frame strip a plurality of lead frames being exposed partially through the apertures in the masking member.

In any event, when a masking member with a plurality of apertures is provided, a plurality of semiconductor devices may be mounted simultaneously on the lead frame strip in a batch process, by multihead automatic apparatus.

The semiconductor devices may be tested after they are mounted on the lead frame strip and if found to be faulty, or to be improperly mounted, may be removed.

The conductors 14 of the carrier lead frames 11 of the strip 10 initially may be formed electrically isolated from each other when the silver layer is etched.

The lead frames 11, 52 and 41 may be of any convenient material, for example, the carrier lead frame 11 may be of copper instead of silver. The insulating substrate 13, when provided, may be of a polyester or of a polyamide instead of a polyimide.

The final encapsulation of the semiconductor device 21 or 53 may be in any suitable moulding compound, or may be within an evacuated enclosure, the parts of which enclosure are sealed hermetically to the conductors 14, 51 or 40 of the lead frames.

Instead of a dual-in-line completed package as shown in FIG. 6 the package may have conductors extending from each side of a square or rectangular shaped package. In either such arrangement, the ends of the conductors beyond the encapsulation for the semiconductor device may be bent so that they may be received in a co-operating socket.

A carrier lead frame-semiconductor device combination may be mounted on a conventional header arrangement, instead of a main lead frame, in order to complete the support for the device.

What we claim is:

1. A continuous process for mounting semiconductor devices each of which are rectangular-shaped in plan and having contacts thereon on a continuous strip including a plurality of lead frames, the lead frames being uniformly spaced along the longitudinal axis of the strip, each lead frame having a matrix of conductors, the end portions of which are adapted for connection to the contacts of a corresponding semiconductor device comprises placing in the desired registration on a lead frame of the lead frame strip a masking member to define at least one rectangular-shaped aperture for accurately locating a semiconductor device, continuously feeding the lead frame strip and masking member longitudinally between a first and a second station with the aperture defined in the masking member being in a desired registration on a lead frame of the lead frame strip such that the conductor end portions of that lead frame are exposed through the aperture, precisely positioning the lead frame and the masking member with respect to each other as they are fed such that when a corresponding semiconductor device is inserted in the required orientation into the aperture each device contact is exclusively opposite to a co-operating conductor end portion, and bonding the device contacts to the co-operating conductor end portions.

2. A method as claimed in claim 1 in which the aperture defined in the masking member is square-shaped in plan, and further including the step of positioning a corresponding semiconductor device which is also square-shaped in plan in said aperture when the masking member is in the desired registration with the lead frame strip during the path of travel of the masking member and the lead frame strip between said first and said second station as said strip is fed.

3. A method as claimed in claim 1 in which the masking member defines a plurality of apertures disposed along the longitudinal axis of the masking member, and said lead frame strip and masking member are fed adjacent each other such that consecutive apertures expose conductor end portions of consecutive lead frames of the lead frame strip.

4. A method as claimed in claim 1 including at least one sprocket wheel at one of said stations, said sprocket wheel engaging co-operating sprocket holes formed in both the masking member and the lead frame strip to feed the masking member and the lead frame strip in the desired registration with each other between said first and said second stations upon rotation of said sprocket wheel.

5. A method as claimed in claim 1 including the step of automatically inserting corresponding semiconductor devices in each aperture defined in the masking member when the masking member is in the desired registration with the lead frame strip, during the travel of the masking member and the lead frame strip between the first and second stations.

6. The method as claimed in claim 1 wherein said lead frame strip and masking member are fed in a controlled manner.

7. A method as claimed in claim 6 wherein said lead frame strip and masking member are disposed to pass over said sprocket wheel together to take into account the curvature of the sprocket wheel over which the lead frame strip and masking member pass.

8. A continuous process for mounting semiconductor devices each rectangular-shaped in plan on a strip of corresponding lead frames, the lead frames being uniformly spaced along the longitudinal axis of the strip, each lead frame having a matrix of conductors, the end portions of which are adapted for connection to contacts of a corresponding semiconductor device comprises continuously feeding and positioning a masking member to define at least one rectangular-shaped aperture, continuously feeding the lead frame strip longitudinally between a first and a second station with the aperture defined in the masking member being in a desired registration on a lead frame of the lead frame strip such that the conductor end portions for connection to contacts of a corresponding semiconductor device are exposed through the aperture, precisely positioning the lead frame and the aperture such that when a corresponding semiconductor device is inserted in the required orientation into the aperture each device contact is exclusively opposite to a co-operating conductor end portion, and bonding the device contacts to the co-operating conductor end portions, the aperture defined in the masking member having dimensions to allow a corresponding semiconductor device to be a sufficiently close fit within the aperture to ensure that each device contact exclusively is opposite to the conductor end portion to which the contact is to be connected when the masking member is in the required registration with the lead frame.

9. A method as claimed in claim 8 wherein said lead frame strip and masking member are rotatably fed over a wheel supported at said first station and a second wheel rotatably supported at said second station, at least one of said wheels positively driving said lead frame strip and said masking member in a controlled manner.

10. A method as claimed in claim 8 in which the aperture defined in the masking member is square-shaped in plan and further includes the step of positioning a corresponding semiconductor device which is also square-shaped in plan.

11. A method as claimed in claim 8 in which the masking member includes a plurality of apertures and further including the step of exposing consecutive conductor end portions of consecutive lead frames of the lead frame strip through the apertures.

12. A method as claimed in claim 9 wherein said positive driving step includes feeding the masking member and the lead frame strip in desired registration with each other through said part of the apparatus upon rotation of a sprocket wheel, said sprocket wheel engaging co-operating sprocket holes formed in both the masking member and the lead frame strip.

13. A method as claimed in claim 8 further including automatically inserting corresponding semiconductor devices in each aperture defined in the masking member when the masking member is in the desired registration with the lead frame strip during the path of travel of the masking member and the lead frame strip between the first and second stations.

14. A continuous process for mounting semiconductor devices each rectangular-shaped in plan on a strip of corresponding lead frames, the lead frames being uniformly spaced along the longitudinal axis of the strip, each lead frame having a matrix of conductors, the end portion of which are adapted for connection to contacts of a corresponding semiconductor device comprises defining at least one rectangular-shaped aperture, in a masking member continuously feeding the lead frame strip longitudinally between a first and a second station transporting the aperture defined in the masking member so as to maintain the aperture in a desired registration with a lead frame of the lead frame strip such that conductor end portions for connection to contacts of a corresponding semiconductor device are exposed through the aperture, precisely positioning the lead frame and the aperture such that when a corresponding semiconductor device is inserted to the required orientation into the aperture each device contact is exclusively opposite to a co-operating conductor end portion, and bonding the device contacts to the cooperating conductor end portions, the lead frame strip and the masking member being fed one atop the other the aperture defined in the masking member such that the leading walls of the aperture as the masking member is fed between said stations are inclined in relation to the longitudinal axis of the lead frame strip and each device contact exclusively is opposite to the conductor end portion to which the contact is to be connected when the masking member is in the required registration with the lead frame and the device is contiguous with the following walls of the aperture.

15. A method as claimed in claim 14 including the step of maintaining the semiconductor device contiguous with the following walls of the aperture.

16. A method as claimed in claim 15 in which the step for maintaining the corresponding semiconductor device contiguous with the following walls of the aperture includes contacting said device with a brush mounted adjacent the path of travel of the lead frame strip and masking member to sweep the semiconductor device into the required position as the masking member and the lead frame strip are fed from the first station to said second station.

17. A method as claimed in claim 14 wherein said lead frame strip and masking member are positively fed by a first wheel rotatably supported at said first station or a second wheel rotatably supported at said second station, at least one of said wheels being a sprocket wheel and said lead frame strip and said masking member each including sprocket holes spaced along the length thereof such that said sprocket wheel engages the sprocket holes of said lead frame strip and said masking member and feeds said strip and said member in a controlled manner.

18. A method as claimed in claim 14 in which the aperture defined in the masking member is square-shaped in plan and further includes the step of positioning a corresponding semiconductor device which is also squareshaped in plan.

19. A method as claimed in claim 14 including exposing conductor end portions of consecutive lead frames of the lead frame strip is consecutive apertures in the masking member.

20. A method as claimed in claim 14 wherein both the masking member and the lead frame strip are positively fed in the desired registration with each other through said apparatus.

21. A method as claimed in claim 14 further including automatic inserting corresponding semiconductor devices in each aperture defined in the masking member when the masking member is in the desired registration with the lead frame strip between the first and second stations.

22. A continuous process for mounting semiconductor devices each rectangular shaped in plan on a strip of corresponding lead frames, the lead frames being uniformly spaced along the longitudinal axis of the strip, each lead frame having a matrix of conductors, the end portions of which are adapted for connection to contacts of a corresponding semiconductor device, comprises positioning a masking member to define at least one rectangular-shaped aperture for accurately locating the semiconductor devices, positively feeding the lead frame strip and the masking member longitudinally between a first and a second station with the aperture defined in the masking member being in a desired registration on a lead frame of the lead frame strip such that conductor end portions for connection to contacts of a corresponding semiconductor device are exposed through the aperture, the lead frame strip and the masking member being fed continuously one atop the other such that the lead frame and the aperture are in the required orientation for insertion into the aperture of a semiconductor device with each device contact being exclusively opposite to a co-operating conductor end portion, bonding the device contacts to the co-operating conductor end portions between the stations.

23. A method as set forth in claim 22 wherein said positive feeding step includes engaging said lead frame strip and masking member with at least one sprocket wheel at one of said stations, to feed the masking member and the lead frame strip in the desired registration with each other continuously between said first and said second stations upon rotation of said sprocket wheel.

24. A method as claimed in claim 22 including compensating for the curvature of the sprocket wheels.

25. A method as claimed in claim 24 including maintaining the aperture defined in the masking member to allow a corresponding semiconductor device to be a sufficiently close fit within the aperture so as to ensure that each device contact exclusively is opposite to the conductor end portion to which the contact is to be connected when the masking member is in the required registration with the lead frame.

26. A method as claimed in claim 24 including feeding the leading walls of the aperture as the masking member is fed through the apparatus in inclined relation to the longitudinal axis of the lead frame strip, and maintaining each device contact which is exclusively opposite to the conductor end portion to which the contact is to be connected when the masking member is in the required registration with the lead frame and the device contiguous with the following walls of the aperture.

27. A method as claimed in claim 26 further including positioning the corresponding semiconductor device contiguous with the following walls of the aperture when the masking member is in the desired registration with the lead frame strip.

28. A method as claimed in claim 27 wherein the step of positioning the corresponding semiconductor device continguous with the following walls of the aperture includes sweeping the semiconductor device into the required position as the masking member and the lead frame strip are fed between said stations.

* * * * *

UNITED STATES PATENT OFFICE
CERTIFICATE OF CORRECTION

Patent No. 4,079,509      Dated March 21, 1978

Inventor(s) Sydney Jackson et al.

It is certified that error appears in the above-identified patent and that said Letters Patent are hereby corrected as shown below:

On the cover page the following should be added:

-- [30] Foreign Application Priority Data

Jan. 29, 1972    British Application No. 4259/72
    Aug. 30, 1972    British Application No. 40169/72

Signed and Sealed this

Twenty-sixth Day of September 1978

[SEAL]

Attest:

RUTH C. MASON
*Attesting Officer*

DONALD W. BANNER
*Commissioner of Patents and Trademarks*